United States Patent [19]
Blomgren

[11] Patent Number: 5,828,578
[45] Date of Patent: Oct. 27, 1998

[54] MICROPROCESSOR WITH A LARGE CACHE SHARED BY REDUNDANT CPUS FOR INCREASING MANUFACTURING YIELD

[75] Inventor: James S. Blomgren, San Jose, Calif.

[73] Assignee: S3 Incorporated, Santa Clara, Calif.

[21] Appl. No.: 564,721

[22] Filed: Nov. 29, 1995

[51] Int. Cl.[6] .................................................. G06F 11/00
[52] U.S. Cl. ...................................... 364/488; 364/468.28
[58] Field of Search ...................................... 364/488, 489, 364/49, 468.28; 395/182.09, 182.11; 326/10, 9

[56] References Cited

U.S. PATENT DOCUMENTS

| | | | |
|---|---|---|---|
| 4,233,682 | 11/1980 | Liegergot et al. | 326/10 |
| 4,551,814 | 11/1985 | Moore et al. | 326/10 |
| 4,633,039 | 12/1986 | Holden | 379/32 |
| 4,714,839 | 12/1987 | Chung | 326/10 |
| 4,907,228 | 3/1990 | Bruckert et al. | 395/182.09 |
| 5,155,729 | 10/1992 | Rysko et al. | 395/182.09 |
| 5,249,188 | 9/1993 | McDonald | 371/68.3 |
| 5,339,408 | 8/1994 | Bruckert et al. | 395/585 |
| 5,440,724 | 8/1995 | Boothroyd et al. | 371/22.5 |
| 5,583,987 | 12/1996 | Kobayashi et al. | 395/182.11 |

Primary Examiner—Vincent N. Trans
Attorney, Agent, or Firm—Stuart T. Auvinen; Fenwick & West LLP

[57] ABSTRACT

Manufacturing yield is increased and cost lowered when a second, substantially identical CPU core is placed on a microprocessor die when the die contains a large cache. The large cache is shared among the two CPU cores. When one CPU core is defective, the large cache memory may be used by the other CPU core. Thus having two complete CPU cores on the die greatly increases the probability that the large cache can be used, and the manufacturing yield is therefore increased. When both CPU cores are functional, the die may be sold as a dual-processor. However, when no dual-processor chips are to be sold, the die are still manufactured as dual-processor die but packaged only as uni-processor chips. With the higher total yield of the dual-CPU die, the dual-CPU die may be packaged solely as uni-processor chips at lower cost than using uni-processor die. An on-chip ROM for generating test vectors, a floating point unit, and a bus-interface unit are also shared along with the large cache.

13 Claims, 9 Drawing Sheets

MICROPROCESSOR WITH A LARGE CACHE SHARED BY REDUNDANT CPUS FOR INCREASING MANUFACTURING YIELD

BACKGROUND OF THE INVENTION

1. Field of the Invention

This invention relates to manufacture of complex IC's, and more particularly for methods to increase the manufacturing yield of microprocessors.

2. Description of the Related Art

Integrated circuits (IC's) have dramatically driven down costs of electronic systems. Many IC's are fabricated together on a silicon wafer, spreading the manufacturing cost of the wafer over many IC die. Reducing the size of the IC die results in more die on the wafer and hence lower cost. Additionally, reducing the size of the die increases the proportion or ratio of functional die to the total number of die on the wafer. The ratio of good die, known as the manufacturing yield, increases for smaller die because the yield is inversely related to the average number of defects on a single die. Thus yield is strongly affected by die size, and smaller die cost less not only because there are more raw die on a wafer, but also because the yield increases for the smaller die. However, the cost of an integrated circuit is greater than just the die cost. Testing and packaging costs are substantial, especially for very complex chips such as microprocessors. A large microprocessor might have a die cost of $100, but testing the wafer and packaged die add another $20 to the cost, and the package itself can add another $20. Packaging and probing yields below 100% can reduce the number of good parts. Thus the $100 die cost translates to a $170 final cost for the microprocessor chip.

Redundancy has successfully been used to increase the manufacturing yield and thus reduce the die cost. Redundancy has been very successful for large regular structures such as memory arrays. A large memory often has additional rows and additional columns that replace defective rows or columns in the array. Since the structure is very regular, it is simple to multiplex the spare row or column to replace the defective row or column. Thus the yields of regular memories has been improved with redundant array elements.

Unfortunately, other complex chips are not as regular as memory arrays. Microprocessors are extremely complex and irregular, having large amounts of seemingly 'random' logic. Providing redundancy for microprocessors is difficult since microprocessors are not large regular arrays which can be provided with spare array elements. Providing redundant elements for the random logic within a microprocessor is a daunting task as each random logic element differs from other random logic elements. To replace a defective random logic element with a redundant logic element often requires that muxing or selecting logic be inserted into the speed-critical paths of the microprocessor, which can slow down the processor with the additional loading and longer routing wires necessary to cross the increased logic area.

What is desired is a method to increase manufacturing yield of complex microprocessors. It is desired to provide redundancy for the random logic portions of complex microprocessors as well as for the regular array portions of complex chips. It is desired to provide this redundancy without loading down the speed-critical paths in the microprocessor.

SUMMARY OF THE INVENTION

Microprocessors are fabricated on a wafer that has a plurality of dual-processor die. Each dual-processor die has a first CPU core and a second CPU core and a shared memory formed therein. A plurality of bonding pads is formed on each dual-processor die.

Temporary electrical contact is made with the plurality of bonding pads on a first die and stimuli are applied to the plurality of bonding pads on the first die to test the shared memory for defects. The first die is marked as defective when the shared memory is determined to contain an un-repairable defect. Stimuli are then applied to the plurality of bonding pads on the first die to test the first CPU core for defects. Stimuli are also applied to the plurality of bonding pads on the first die to test the second CPU core for defects.

The first die is marked as defective when both the first CPU core and the second CPU core are determined to contain defects. However, the first die is indicated as functional when the shared memory and either the first CPU core or the second CPU core or both do not contain defects.

The temporary electrical contact with the first die is removed and electrical contact with other dual-processor die on the wafer is successively made and the steps repeated for testing and marking the other dual-processor die. Thus dual-processor die are indicated as functional when the shared memory and either the first CPU core or the second CPU core or both do not contain defects. The dual-processor die are indicated as functional when one of the CPU cores is defective but the other CPU core is functional.

In further aspects of the invention the wafer is sawed into individual die. Die marked as defective are separated from die indicated to be functional. Die indicated to be functional are packaged as single-microprocessor chips by disabling either the first CPU core or the second CPU core. Thus die are packaged as single-microprocessor chips when either one or both of the CPU cores are functional and the shared memory is functional.

In still further aspects of the invention, indicating that the first die is functional comprises marking the dual-processor die with a first marking when the shared memory and the first CPU core do not contain defects but marking the dual-processor die with a second marking when the shared memory and the second CPU core or both do not contain defects. Packaging die indicated to be functional as single-microprocessor chips is accomplished by disabling one of the two CPU cores. Disabling the second CPU core is accomplished by bonding an option bonding pad to activate a means for disabling the second CPU core. The second CPU core is disabled by powering-down the second CPU core.

DETAILED DESCRIPTION

Figure 1:
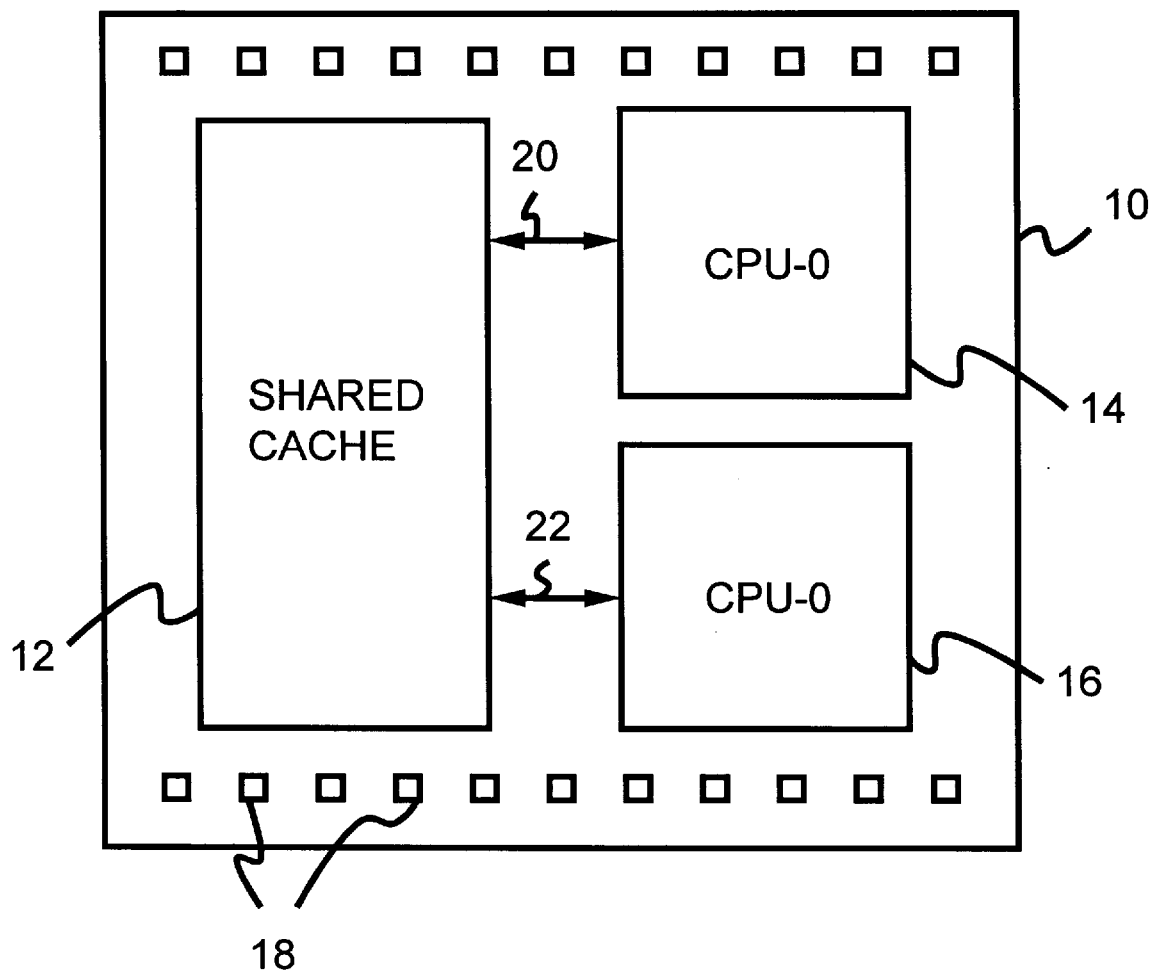
FIG. 1 is a diagram of a dual-processor die with two CPU cores sharing a large cache memory.

The present invention relates to an improvement in microprocessor manufacturing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

On-chip cache memories are commonly included with present-day microprocessors. These cache memories are regular array structures, so a few redundant rows and/or columns can be multiplexed to replace any one of hundreds or thousands of rows and/or columns. The yield for these cache arrays is high when such redundancy is used.

Redundancy for the central processing unit (CPU) core of the microprocessor chip is more problematic. Since the CPU core consists of generally random logic blocks for control and datapaths, many different types of redundant logic blocks are needed. While one redundant row in a memory array can provide redundancy for thousands of identical row or memory cells, a redundant logic block may only provide redundancy for a single logic block of random control logic. Thus thousands of different types of redundant logic blocks are potentially needed, each for a specific portion of the random logic on the processor.

MultiProcessors Use CPU Chips without Redundancy

Multi-processors have been used for compute-intensive applications such as network servers and complex scientific calculations and modeling. These multi-processors employ several separate microprocessor chips on circuit boards connected together by various types of bus architectures and caches. Dual-processors for personal computers have been popularized by companies such as Compaq Computer. However, microprocessor chips continue to be single processors with a single CPU core, although a large cache is often added to the microprocessor die. The second CPU in a dual-processor system is not used as a redundant processor to lower manufacturing cost. Instead, the second processor is used to execute a second program in parallel to a first program running on the first processor. Thus dual-processors are used to double the maximum execution throughput.

2nd, Redundant CPU Core Increases Probability of Good Die

The inventor has carefully studied manufacturing yield characteristics and has discovered that a second CPU on a die may be used as a redundant element to replace a defective CPU. The redundant CPU lowers manufacturing cost much the same way as redundant rows and columns reduce the manufacturing cost of a memory array. While it is impractical to provide individual redundant logic elements for all portions of a CPU core, it is easier to lay out an entire second CPU core. Redundant logic elements do not have to be muxed into speed-critical paths throughout the CPU core; instead simple muxing logic may replace the entire CPU core with a second, redundant core should the first CPU core contain a manufacturing defect.

Merely adding a second CPU core doubles the die size and consequently decreases the yield. However, when a large memory array is also present on the die, the second CPU sufficiently increases the yield to offset the lager die size. The yield increases because with a second CPU core it is more likely that at least one of the CPU cores can be used with the large memory array.

Since the memory array includes row or column redundancy, it is more likely that the memory array is functional. This redundancy makes the large memory array fault-tolerant while a single defect in the CPU core cannot be tolerated unless a redundant CPU core is provided.

Large Fault-Tolerant Memory Shared by 2 CPU Cores

The large memory array is used as a cache for either the first or the second CPU core. Thus if either CPU core is functional, the large cache can be used. If only one CPU core is placed on the die with the large cache array, then the entire die cannot be used when the only CPU core is defective. With two CPU cores on the die, the large memory array can be used when either CPU core is functional. Thus the large memory array is more likely to be used when a second, redundant CPU core is present on the die. Indeed, the second CPU core practically doubles the probability that a large memory array is used and that the die is good, since two rather than just one CPU core are available.

Dual-Processor Die with Shared Memory Array—FIG. 1

FIG. 1 is a diagram of a dual-processor die with two CPU cores sharing a large cache memory. Die 10 includes a first CPU core 14 and a second CPU core 16. These CPU cores are substantially identical in function and possibly in layout. A large cache memory 12 serves as a cache to either the first or second CPU core 14, 16. Data stored in cache memory 12 is accessible by CPU cores 14, 16 over busses 20, 22, respectively. Cache memory 12 is simply provided with one or more additional ports to allow communication with second CPU core 16. Cache memory 12 typically includes an additional port to an external bus through pads 18 for an external requester, to allow for cache line invalidations and snooping.

Cache memory 12 is a second-level cache when CPU cores 14, 16 contain within them a primary cache. The first-level primary caches are preferably within the CPU cores 14, 16 so that these primary caches can quickly supply instructions and operands to the execution pipelines within CPU cores 14, 16. If cache memory 12 were the primary cache, then sharing cache memory 12 between two CPU cores would increase the loading and length of interconnect busses 20, 22 to the CPU cores 14, 16, increasing delays and slowing down the speed of the processor. Since the primary caches have a moderately high hit rate, most requests from the pipelines within CPU cores 14, 16 are handled by the primary caches within these cores. Thus the relatively few primary cache misses do not significantly reduce performance if busses 20, 22 to cache memory 12 become longer and slower because the second CPU core 16 is added to the die.

Cache memory 12 is shared by both CPU cores 14, 16. When only one CPU core is functional, then the entire storage area of cache memory 12 is available for that one functional CPU core. When both CPU cores 14, 16 are functional, then cache memory 12 may be shared between the two CPU cores, either by some partitioning of cache memory 12, or by allowing either CPU core to access any location in cache memory 12 and allowing cache lines to be allocated as needed. When cache memory 12 is a set-associative cache, some of the sets on replacement can have an affinity to one CPU core while other sets can have an affinity toward the other CPU core, although when all sets for one CPU core are used, the other CPU core's sets can then be allocated to the first CPU core.

Cache memory 12 may itself be a composite memory structure, including translation-lookaside buffers (TLB's), system registers, and other storage areas besides just instructions and data. The bus-interface unit (BIU) is preferably included in cache memory 12 so that the BIU is shared between the two CPU cores as well. Thus a single BIU to the external pads 18 is also shared between the 2 CPU cores.

Die 10 is packaged as a dual-processor chip when both CPU cores 14, 16 and cache memory 12 are all functional. When only one of the two CPU cores 14, 16, and cache memory 12 are functional, then die 10 is packaged as a uni-processor by using a bonding option to bonding pads 18. The bonding option disables the defective CPU core using many possible approaches. The bonding option can activate power-supply logic to ground the power supply to the defective CPU core, or the bonding option can disconnect cache memory 12 from the defective CPU core by blocking requests from that defective CPU core, or by disconnecting its interconnect bus. The bonding option may also disable a defective CPU core by preventing state machines in its control logic from leaving the reset state. However, since it is desired to reduce power as much as possible, powering-down the defective CPU core is the preferred method. The bonding option can be as simple as an option pin that is bonded to ground to disable a CPU core, with the ground voltage being sensed and used to permanently power-down the defective CPU core. A fusible element can also be used in place of the bonding option.

Cache memory 12 is indeed large in comparison to the sizes of CPU cores 14, 16, perhaps being twice the size of a single CPU core. Redundancy can make it much more likely that cache memory 12 is functional, even though it has a larger size. As process technology continues to improve, especially with dense multi-layer-metal routing, CPU cores 14, 16 may continue to shrink while larger-capacity cache memories are employed, making the relative size of each CPU core decrease and making the invention more effective.

Yield Projections Comparing Uni- To Dual-CPU Die

Table 1 shows estimates of die area for the shared cache memory 12 and CPU core 14 or 16 and the resulting number or raw die on a 200 mm (8-inch) wafer. For standard uni-processor (UP) die, the total die area is approximately the sum of the cache area and the CPU area. For Dual-processor (DP) die, the total die area is approximated as the sum of the cache area and twice the CPU area. When the 8" wafer is dedicated to UP die rather than to DP die, about 30% more raw die can be fabricated on the 8" wafer. Table 1 compares die areas for three generations of process technology having a metal pitch of 1.4, 1.2, and 1.0 microns (um) for a shared cache of 256K-bytes and 512K-bytes.

TABLE 1

Die Area Affecting Raw Die/Wafer

| | | Area in mm2 | | | Die Per |
|---|---|---|---|---|---|
| | Lithography | Cache | CPU | Total | 8" Wafer |
| DP/256K | 1.4 um | 129 | 49 | 227 | 109 |
| UP/256K | 1.4 um | 129 | 49 | 178 | 143 |
| DP/256K | 1.2 um | 95 | 36 | 167 | 153 |
| UP/256K | 1.2 um | 95 | 36 | 131 | 200 |
| DP/256K | 1.0 um | 66 | 25 | 116 | 229 |
| UP/256K | 1.0 um | 66 | 25 | 91 | 298 |
| DP/512K | 1.0 um | 132 | 25 | 182 | 139 |
| UP/512K | 1.0 um | 132 | 25 | 157 | 164 |

Table 1 shows that uni-processors (UP) do have more raw die per wafer than do dual-processors (DP). However, the number of raw UP die is only about 30% greater than the number of raw DP die because the large cache memory occupies about twice the area of the CPU core itself. When a much larger cache size of 512K-bytes is used, then the difference between the raw number of UP and DP die dwindles to only 18%.

Manufacturing Yield

The die area occupied by a die, or a portion of the die, is directly related to the probability that the die or portion of the die is functional, its yield. The true manufacturing yield of a wafer has been approximated by a variety of yield equations. Some of the more popular yield equations known to the public include:

Poison: $y = e^{**-ad}$

Seeds: $y = e^{**-(\text{square root}(ad))}$

Murphy: $y = ((1 - e^{-ad})/ad)^{}2$

Neg. Binomial: $y = (1 + ad/cf)^{**-cf}$

Dingwall: $y = (1 + ad/2)^{**-3}$ where:
  y=yield (from 0.0 to 1.0)
  a=area (square mm)
  d=defect density (defects per square mm)
  **=raised to the power of
  cf=cluster coefficient, where
    1=totally random
    4=high clustering The Dingwall equation is preferred for complex microprocessors and is used in all examples in the present application. A defect density of 0.8 defects/cm$^2$ is used for the CPU core while a lower defect density of 0.6 defects/cm$^2$ is used for the cache to account for redundancy. The Dingwall equation and the areas of the cache and CPU cores from Table 1 are used to calculate the percent yield of the cache and CPU cores for the different sizes for the different process technologies. Table 2 shows the resulting percent yield, or probability that the cache or CPU portions of the die are functionally good. Then these probabilities are used to calculate the probability that a DP or UP die is good.

TABLE 2

% Good Die

| | Lithography | Cache | CPU | Cache & 1 CPU | Cache & 2 CPUs |
|---|---|---|---|---|---|
| DP/256K | 1.4 um | 58 | 37 | 18 | 12 |
| UP/256K | 1.4 um | 58 | 37 | 21 | |
| DP/256K | 1.2 um | 66 | 47 | 22 | 20 |
| UP/256K | 1.2 um | 66 | 47 | 31 | |
| DP/256K | 1.0 um | 75 | 58 | 21 | 33 |
| UP/256K | 1.0 um | 75 | 58 | 44 | |
| DP/512K | 1.0 um | 75 | 36 | 14 | 20 |
| UP/512K | 1.0 um | 75 | 36 | 27 | |

For UP die, the probability is obtained simply by multiplying the probability of the cache being good with the probability of the CPU core being good. Thus for a 256K cache using 1.4 um metal-pitch lithography for the primary metal layer, the probability of a good UP die is 37%×58%= 21%. The cache has a lower yield (37%) than the CPU core (58%) since the cache is larger (129 mm$^2$) than the CPU core (49 mm$^2$).

For a wafer of DP die, there can be good DP die and faulty DP die that can be downgraded to good UP die. A good DP die has a good cache portion and both CPU cores good. A downgraded UP die has a good cache and only one of the two CPU cores functional. The yield of good DP die is calculated by multiplying the cache yield by the square of the CPU yield (cache %×CPU %×CPU %). For 256K, 1.4 um, the yield of good DP die is thus: 37%×58%×58%=12%.

The calculation of the yield of downgraded UP die is more complex. Downgraded UP die are those die with the cache good and either the first CPU core good or the second CPU core good, but not both CPU cores good, since those are DP die. There are thus two cases:

good cache×good 1st CPU×bad 2nd CPU good cache×bad 1st CPU×good 2nd CPU.

The probability of each case is:

cache %×CPU %×(1-CPU %)

cache %×(1-CPU %)×CPU %.

The total probability of a downgraded, good UP die is the sum of these two probabilities, which reduces to:

2×cache %×CPU %×(1-CPU %)

since the yields for the two CPU cores are the same (CPU %).

For 256K, 1.4 um, the yield of downgraded DP die which are good as UP die is thus:

2×37%×58%×(100%-58%)=18%.

Comparing the results for the 256K cache, 1.4 um process, if only UP die are fabricated on the wafer, 21% of the die are good UP die. But if DP die are fabricated, 12% of the die are good DP die while another 18% of the die are good as UP die. Thus a total of 12%+18%=30% of the die are good as either UP or DP chips. The total yield of the DP wafer (30%) is higher than the yield of the UP-only wafer (21%). Thus providing the second, redundant CPU core does indeed increase the yield of good die.

However, this yield increase is countered by the larger die size of the DP die. The DP wafer has 109 raw die while the UP-only wafer has 143 raw die, about 30% more raw die. Multiplying the number of raw die by the yields produces the actual number of good die, as shown in Table 3.

TABLE 3

Actual Good Die, UP vs. DP

| | | | Good Die | | |
|---|---|---|---|---|---|
| | Lithography | Raw Die/wfr | Uni-Processor | Dual-Processor | Total |
| DP/256K | 1.4 um | 109 | 20 | 13 | 33 |
| UP/256K | 1.4 um | 143 | 30 | | 30 |
| DP/256K | 1.2 um | 153 | 34 | 31 | 65 |
| UP/256K | 1.2 um | 200 | 62 | | 62 |
| DP/256K | 1.0 um | 229 | 48 | 76 | 124 |
| UP/256K | 1.0 um | 298 | 131 | | 131 |
| DP/512K | 1.0 um | 139 | 19 | 28 | 47 |
| UP/512K | 1.0 um | 164 | 44 | | 44 |

Thus for 256K, 1.4 um, the number of good die for the UP-only wafer is:

21% UP-only×143 raw die/wafer 30 good UP-only die.

For the DP wafer:

12% DP yield×109 raw die/wafer=13 good DP die

18% UP yield×109 raw die/wafer=20 good UP die.

The UP-only wafer yielded 30 good die while the DP wafer yielded a total of 33 good die, 3 more good die than the UP-only wafer, despite the larger die size of the DP die. The 3 more good die represents a 10% increase in the number of good, salable die. Not only has the number of good die increased by using the DP die, but 13 of the 33 good die are DP die rather than just UP die. Since the good DP die have two good CPU cores, they command a higher sales price than the UP die. The DP chips may be sold for up to double the price of the UP die. For example, if UP die sell for $300, the DP die might be sold for $600, although the price can vary. The total revenue from the DP wafer is the sum of:

13 good DP die×$600=$7800

20 good UP die×$300=$6000 or $13,800. In comparison, the revenue from the UP-only wafer is 30 good UP die×$300=$9000.

The DP wafer produces 50% more revenue than does the UP-only wafer. Even when the demand for DP chips is lower than the amount of DP die produced, these DP die can be packaged and sold as UP die. In the extreme case where no DP die are sold at all, and all the DP die are sold as UP die, then the DP wafer produces:

13 good DP die sold as UP×$300=$3900

20 good UP die×$300=$6000 for a total revenue of $9900 for the wafer, $900 higher than the revenue from the UP-only wafer. Thus even if only uni-processors are sold, the DP wafer is more efficient and cost-effective than the UP-only wafer!

Affect of Process Variations on DP Advantage over UP

Table 3 shows that the DP die produced more good die than the UP-only die for all process and cache combinations except one. For the advanced 1.0 um process, with the smaller 256K cache size, the DP wafer yielded 124 good die, while the UP-only wafer yielded 131 good die, 7 more good die than the DP wafer. This is the example with the smallest die size, and with the cache size being the closest to the CPU size. However, when the cache size is increased to 512K, the 1.0 um process yielded 3 more good die with the DP wafer. The DP die are higher yielding when die size is larger rather than smaller. Thus for most combinations the DP wafer yielded more die, but not in all cases.

The yield and good die calculations for Tables 2 and 3 are repeated for varying defect densities and reported in Table 4.

For Tables 2 and 3 the Dingwall equation is used with a defect density of 0.8 defects/cm for the CPU cores, but 0.6 defects/cm² for the cache to account for redundancy in the array portion of the cache. Defects within the array can sometimes be repaired using redundant rows and/or columns, but defects outside of the array, but still in the cache portion of the die cannot be repaired. Thus 0.6 defects/cm² is an approximation.

Table 4 reports the total number of good die for CPU defect densities ranging from 1.1 to 0.6 defects/cm². The total number of good die is the number of good UP die for UP-only wafers, but the sum of all good DP and downgraded UP die for DP wafers. Again the advanced 1.0 um process with the smaller 256K cache was the exception, having better die yields for UP-only wafers for most defect densities. The 1.2 um process at the worst defect density also showed the UP-only wafer with 3 more good die. These exceptions are shown in Table 4 as asterisks.

TABLE 4

Affect of Defect Density on Good Die, UP vs. DP

|  |  | Total Good Die |  |  | (Defects/cm² CPU, Cache) |  |  |
|---|---|---|---|---|---|---|---|
|  | Litho. | 1.1, 0.9 | 1.0, 0.8 | 0.9, 0.7 | 0.8, 0.6 | 0.7, 0.5 | 0.6, 0.4 |
| DP/256K | 1.4 um | 19 | 22 | 27 | 32 | 40 | 47 |
| UP/256K | 1.4 um | 17 | 20 | 25 | 30 | 38 | 47 |
| DP/256K | 1.2 um | 42 | 49 | 55 | 63 | 72 | 83* |
| UP/256K | 1.2 um | 39 | 45 | 52 | 62 | 72 | 86 |
| DP/256K | 1.0 um | 91 | 101* | 110* | 123* | 136* | 148* |
| UP/256K | 1.0 um | 89 | 102 | 113 | 129 | 144 | 162 |
| DP/512K | 1.0 um | 28 | 35 | 40 | 46 | 54 | 64 |
| UP/512K | 1.0 um | 26 | 32 | 37 | 44 | 53 | 64 |

Figure 2:
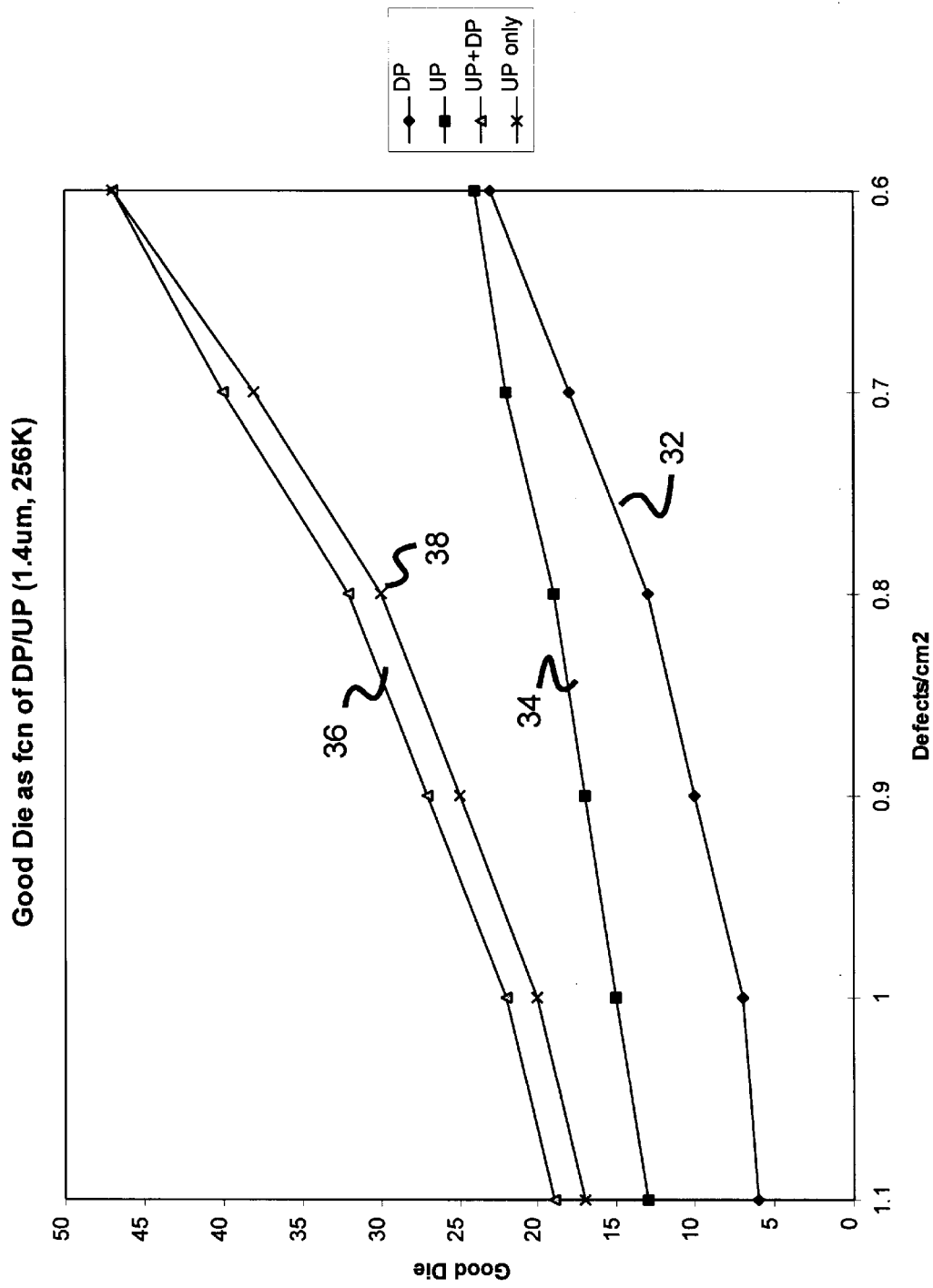
FIG. 2 shows the affect of defect density on DP and UP wafers for the 1.4 um metal-pitch process and a 256K shared cache.

The data from Table 4 is presented graphically in FIGS. 2–5 which show the affect of varying defect densities on DP and UP die yields. FIG. 2 shows the affect of defect density on DP and UP wafers for the 1.4 um metal-pitch process and a 256K shared cache. While DP yield 32 drops off at higher defect densities, the UP yield 34 remains more consistent, allowing the total yield of the DP wafer 36 to remain above the UP-only yield 38.

Figure 3:
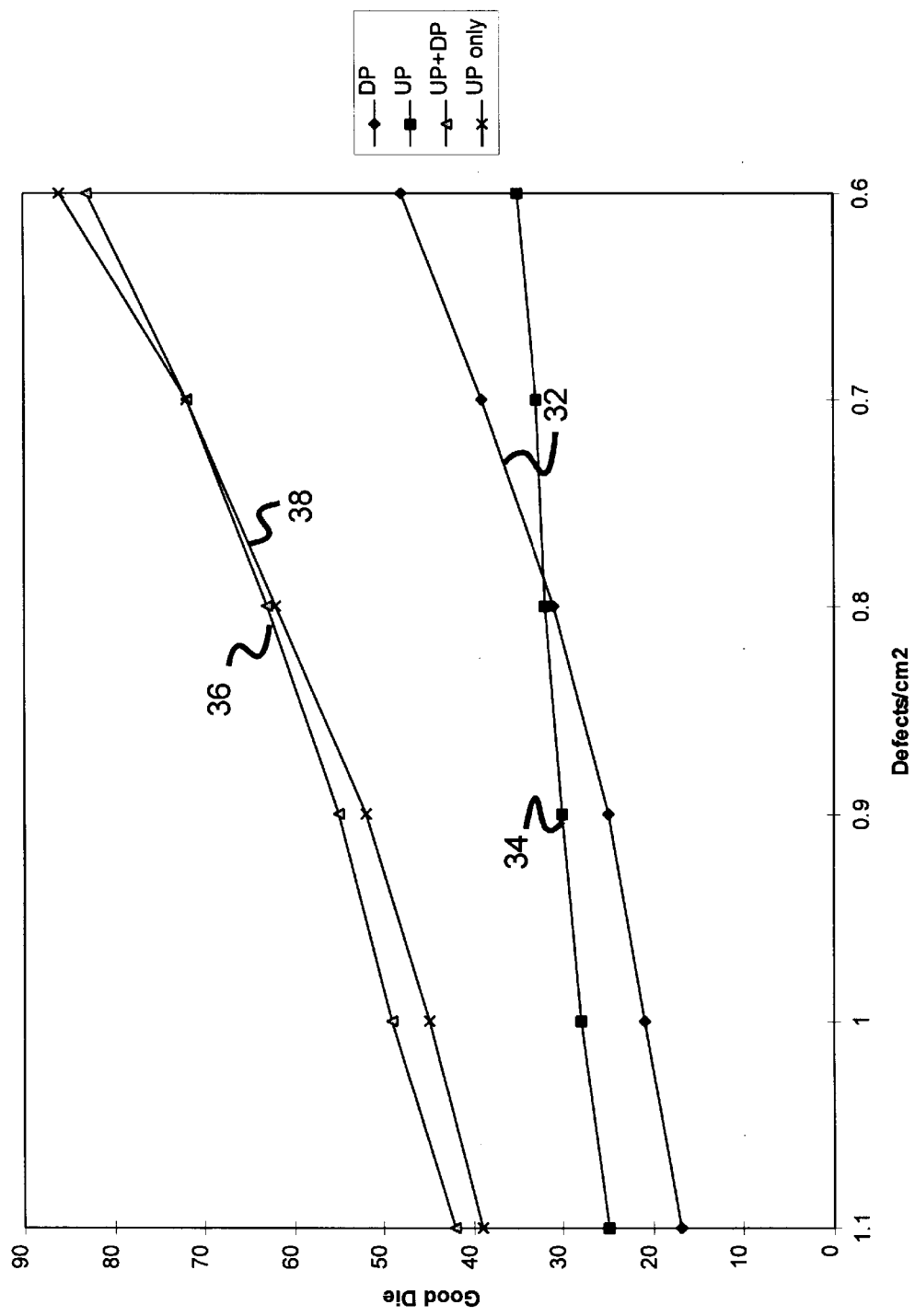
FIG. 3 shows the affect of defect density on DP and UP wafers for the 1.2 um metal-pitch process and a 256K shared cache.

FIG. 3 shows the affect of defect density on DP and UP wafers for the 1.2 um metal-pitch process and a 256K shared cache. While DP yield 32 drops off at higher defect densities, the UP yield 34 remains more constant, allowing the total yield of the DP wafer 36 to remain above the UP-only yield 38. However, at very low defect densities UP-only yield 38 rises above DP wafer yield 36.

Figure 4:
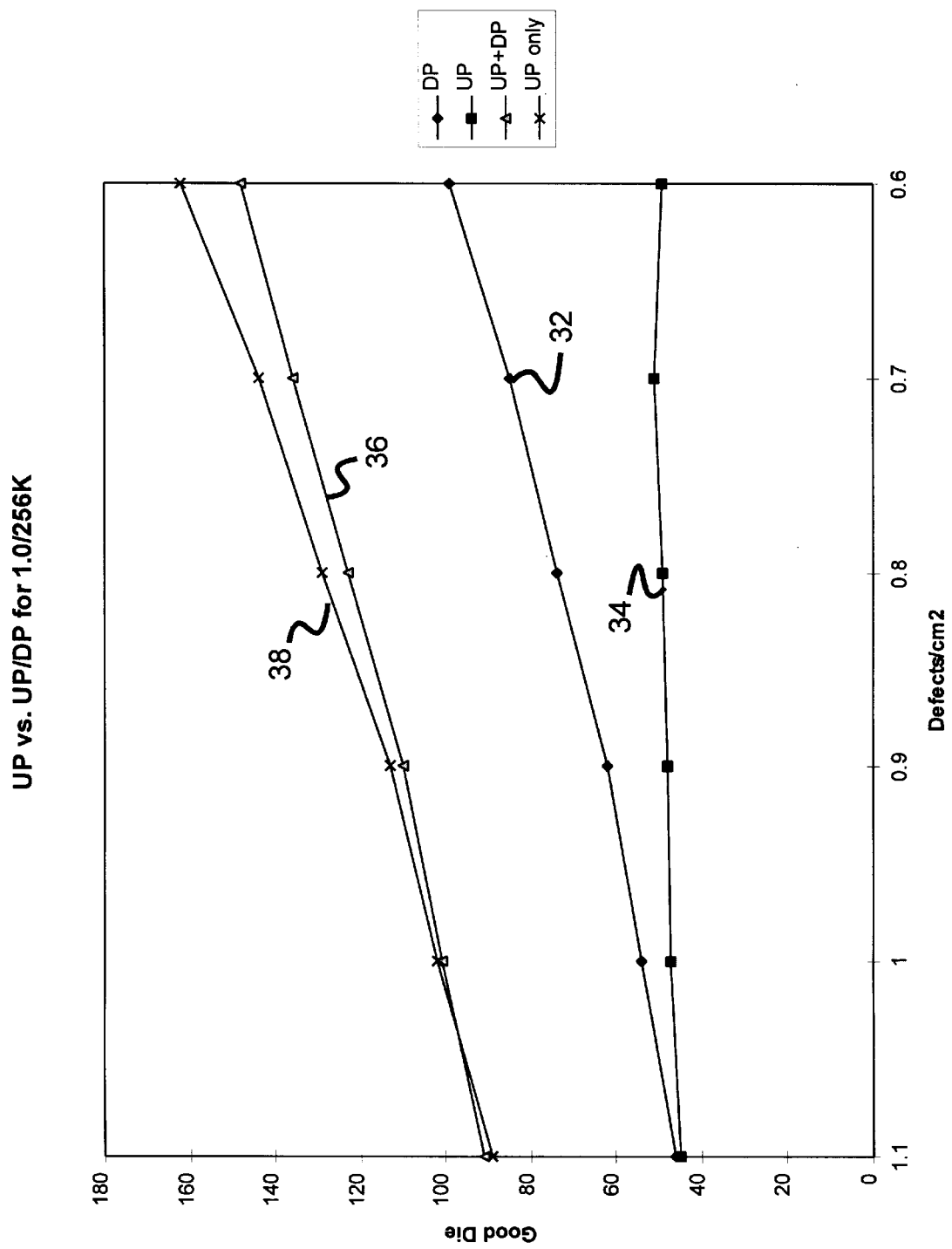
FIG. 4 shows the affect of defect density on DP and UP wafers for the advanced 1.0 metal-pitch um process and a 256K shared cache.

FIG. 4 shows the affect of defect density on DP and UP wafers for the advanced 1.0 um metal-pitch process and a 256K shared cache. DP yield 32 again drops off as defect density increases. The UP yield 34 remains almost constant, possibly because of the very small overall die size. The UP-only yield 38 is higher than DP wafer yield 36 for all defect densities except the highest defect density. The area of the CPU core is closest to the area of the cache for this example.

Figure 5:
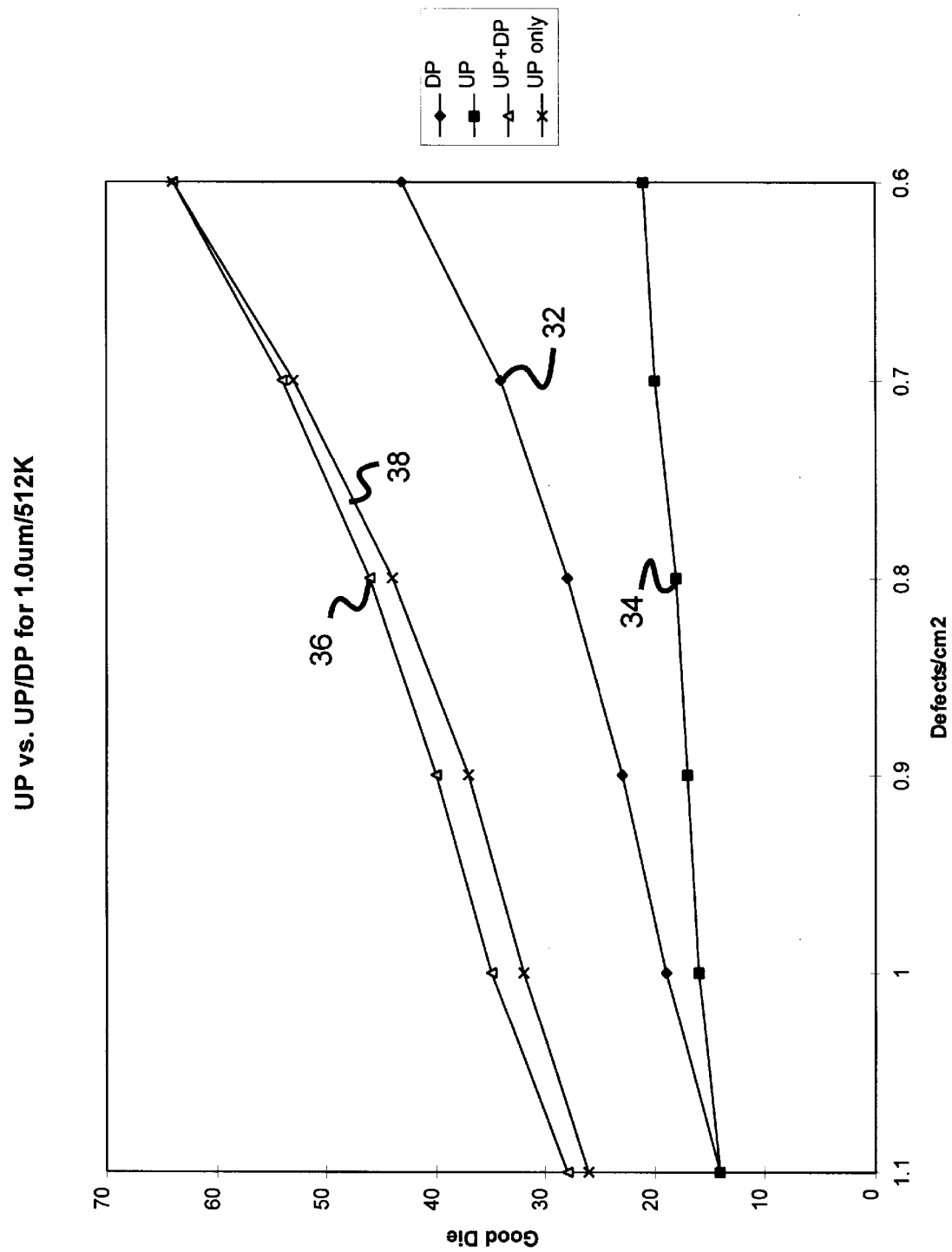
FIG. 5 shows the affect of defect density on DP and UP wafers for the advanced 1.0 metal-pitch um process and a larger 512K shared cache.

FIG. 5 shows the affect of defect density on DP and UP wafers for the advanced 1.0 um metal-pitch process and a larger 512K shared cache. DP yield 32 again drops off sharply as defect density increases. The UP yield 34 remains almost constant. The UP-only yield 38 is lower than DP wafer yield 36 for all defect densities except the lowest defect density where the two are equal.

Thus across a range of defect densities the DP wafer produces more good die for all processes except the 1.0 um metal-pitch with the smaller cache size, where the CPU core size is closest to the cache size. The invention is most effective when the cache is large relative to the CPU cores, since the large cache is usable with either redundant CPU core. When the CPU core size approaches half of the size of the cache, the DP wafer becomes less efficient than the UP-only wafer.

DP/UP Manufacturing Process

Figure 6:
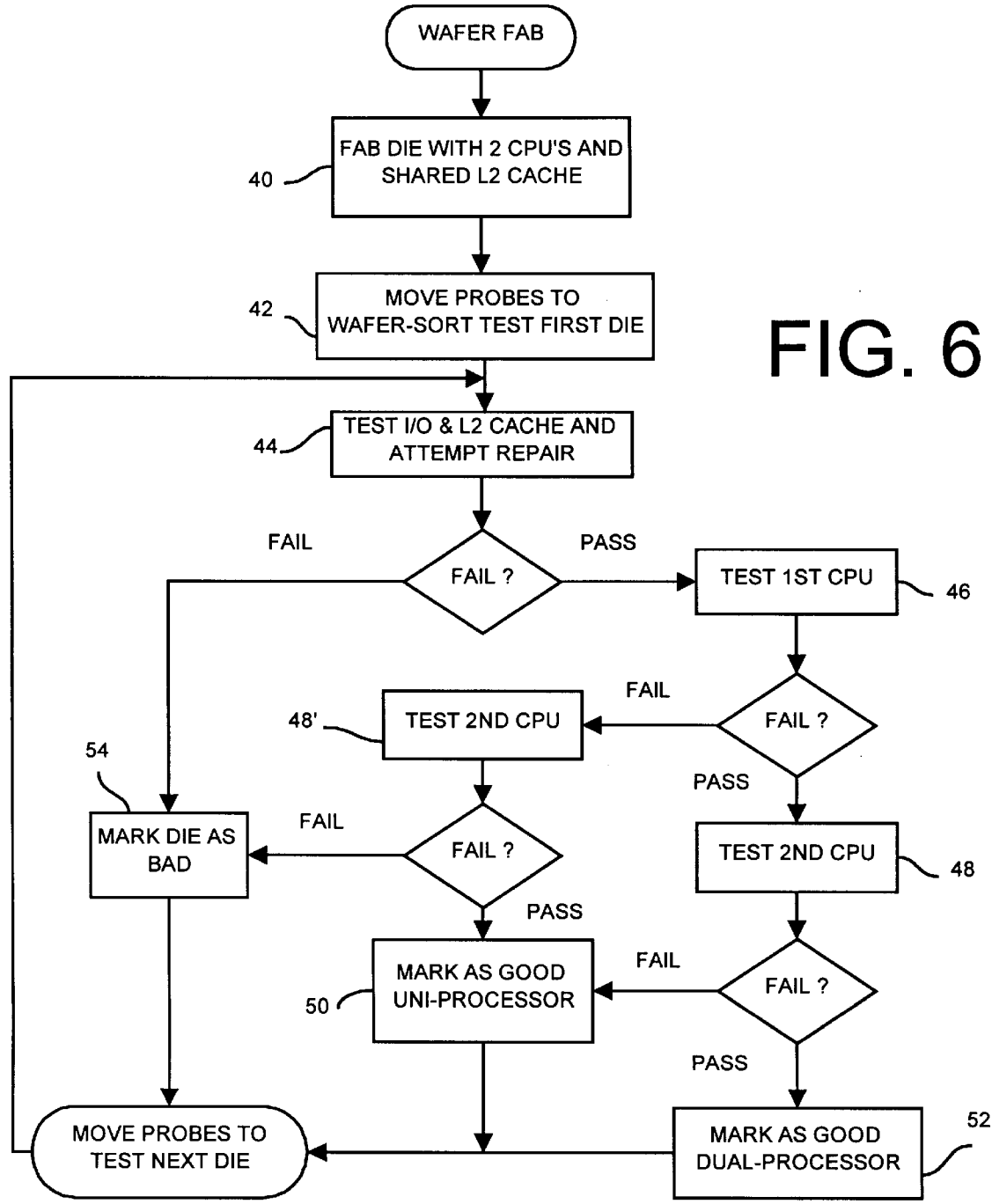
FIG. 6 is a flowchart of a manufacturing process which makes and tests DP die having a large cache shared among two CPU cores.

FIG. 6 is a flowchart of a manufacturing process which makes and tests DP die having a large cache shared among two CPU cores. The lithographic masks are used to transfer the image of the various layers of the die on the wafer. This image contains dual-processor (DP) die as shown in FIG. 1, with two redundant CPU cores and a large shared cache memory. Using well-known process technology one or more wafers containing these DP die are fabricated, step 40. The DP wafer is then tested on a wafer-sort machine which contains needle probes that make contact with bonding pads on the DP die. As the probes contact a DP die, step 42, the DP die is run through a test routine. First the input and output and basic opens and shorts tests are performed. The large shared cache is tested, and repair is attempted if the cache is defective, step 44. If any of these tests fail, the DP die is marked as a bad die by placing a drop of ink of a certain color such as black on the die, step 54. Alternately a computer-readable map of the location of the die may be generated in lieu of inking.

If the DP die passes the cache test in step 44, then the first CPU core is tested, first test 46. The CPU test can be a rather lengthy test because of the complexity of the CPU core. If the first CPU passes, then the second CPU core is tested, second test 48. The same test sequence may be used for both the first and second CPU cores, with just a few signals differing to enable one CPU rather than the other CPU. Should the second CPU core pass second test 48, the die is marked as a good dual-processor (DP) die, step 52, perhaps by another color ink, or no ink at all. When the second CPU fails second CPU test 48, only one CPU is good and the DP die is marked in step 50 as a good uni-processor (UP) die by inking in a separate color (blue).

If the DP die passes the cache test in step 44, but the first CPU fails first test 46, then the second CPU core is tested in second test 48'. Second test 48' can be identical to second test 48 except that passing second test 48' causes the DP die to be marked as a good UP die, step 50, while passing second test 48 causes the die to be marked as a good DP die, step 52. Second test 48' differs slightly from second test 48 since a few signals are used to disable one CPU and not the other.

After the DP die is tested, the probes are lifted up from the DP die and the probes moved to the next DP die on the wafer, and testing resumes with the next DP die until all die on the wafer have been tested.

Packaging DP and UP Die

Figure 7:
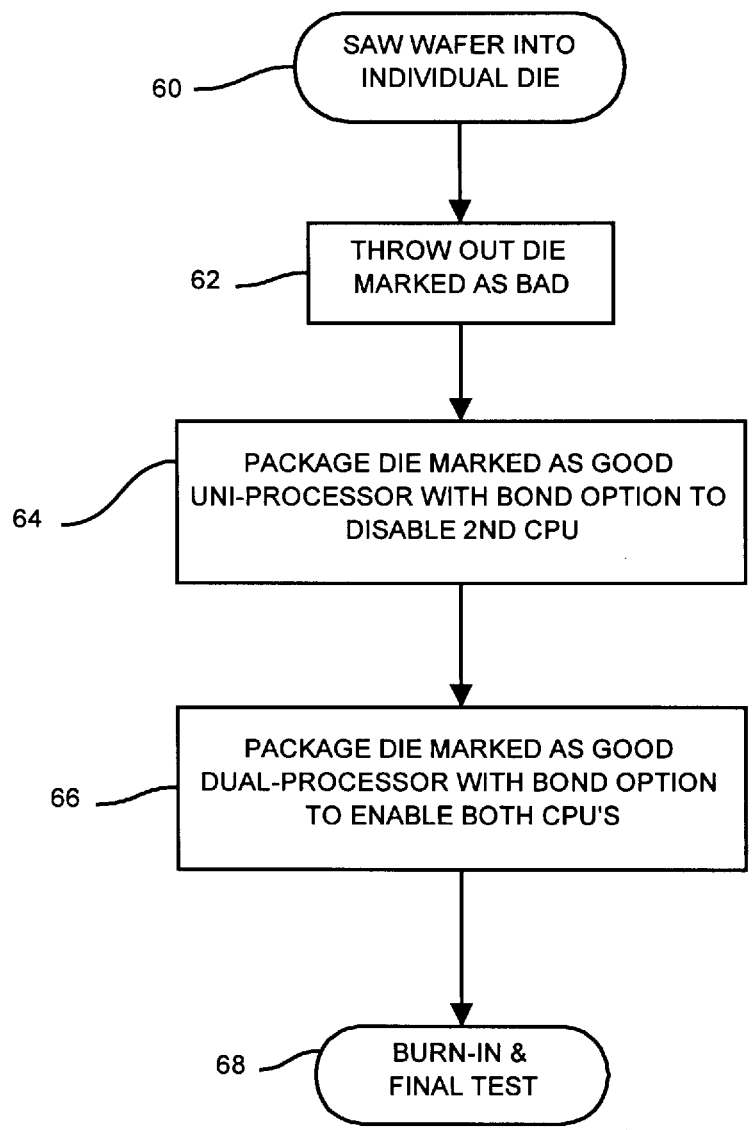
FIG. 7 illustrates the packaging process for uni- and dual-processor die.

FIG. 7 illustrates the packaging process for uni- and dual-processor die. Once the wafer is marked for bad die, good UP and good DP die, as shown in FIG. 6, then the wafer is sawed into individual die, step 60. The die marked as bad die are separated and thrown out, step 62. The remaining die are marked by ink spots as either good dual-processor die or good uni-processor die, which have one of the two CPU cores defective. The good uni-processor die are packaged with a bonding option to enable just the functional CPU core and disable the non-functional core, step 64. This may require that the UP die be additionally marked during step 50 of FIG. 6 to indicate whether the first CPU core or the second CPU core is the functional core.

The die marked as good dual-processor (DP) die are also packaged with a bonding option to enable both CPU cores, step 66. The good packaged UP and DP chips are then final tested to ensure than no errors occurred during sawing packaging, step 68. Before final test, the packaged chips may be burned-in for 24 to 48 hours.

Alternative Process for Up Chips from DP Die

Figure 8:
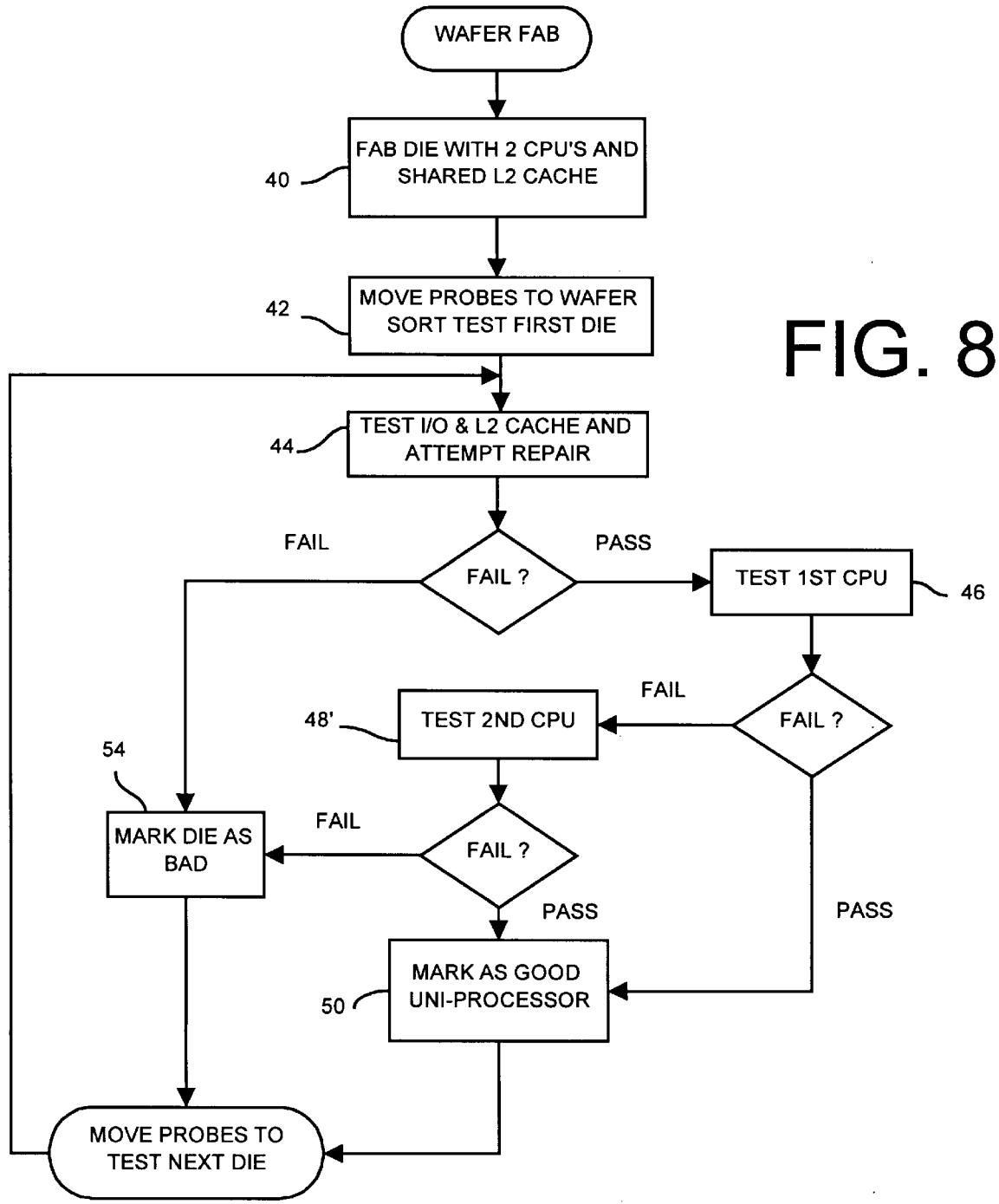
FIG. 8 illustrates an alternative process using DP die to make only UP parts.

FIG. 8 illustrates an alternative process using DP die to make only UP parts. Because the DP wafer has a higher total yield than a UP-only wafer, it is desirable to manufacture only DP wafers, even when no dual-processor parts are to be sold. When a DP die has both CPU cores functional, one of the functional cores is disabled by the bonding option to make a uni-processor part.

The same basic steps described for FIG. 6 are followed. However, if the DP die passes the first CPU test 46, the DP die is immediately marked as a good UP die, step 50. The second CPU test 48' is only activated when the first CPU test 46 fails. If the second CPU test 48' passes, the DP die is marked as a good UP die, perhaps with a different color ink to signify the second CPU core is good rather than the first CPU core. Thus only good UP die are packaged, although the wafer contains DP die.

Shared ROM for Self-Test

Figure 9:
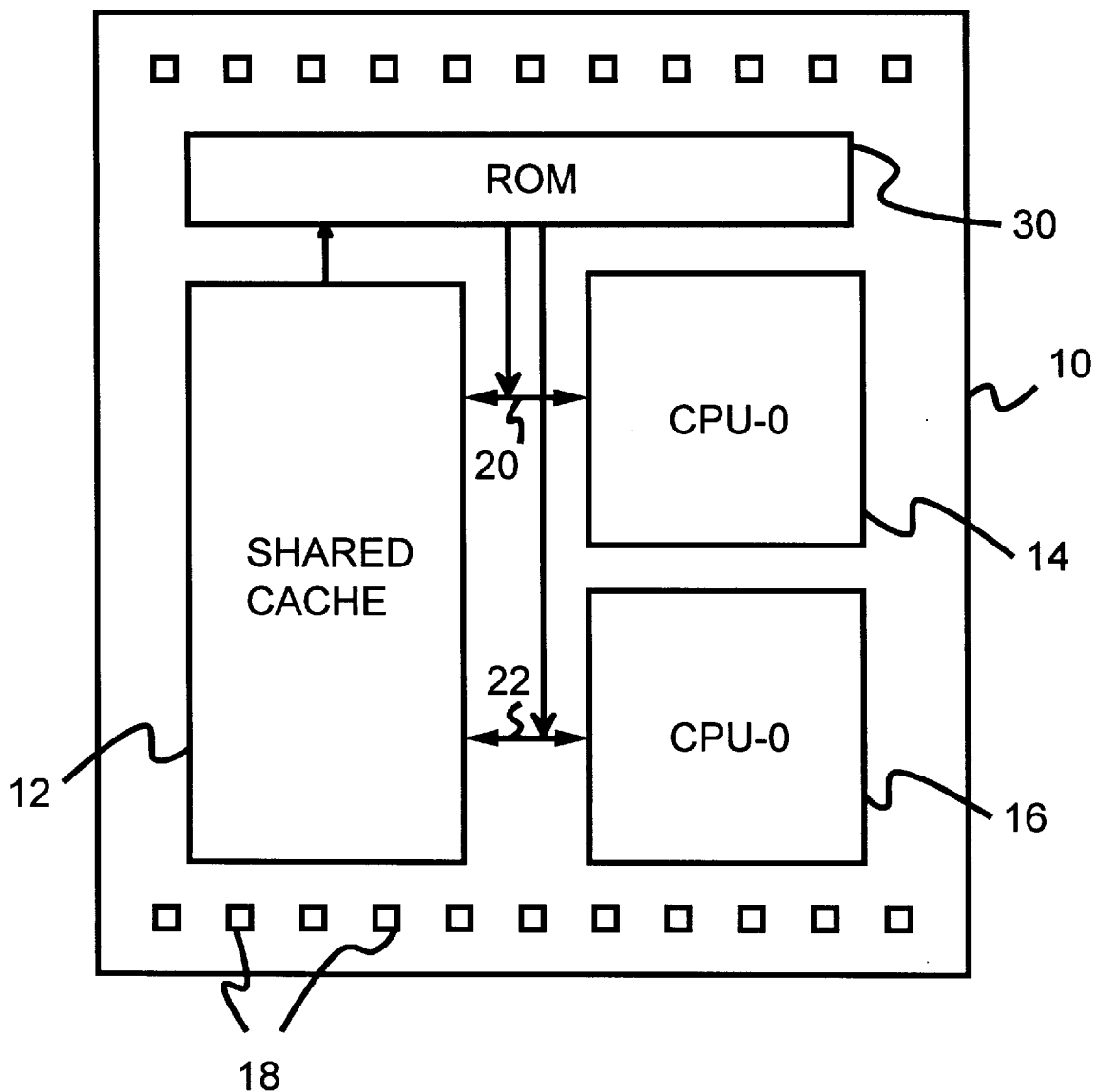
FIG. 9 shows a read-only memory (ROM) containing test routines which is shared among the two CPU cores.

FIG. 9 shows a read-only memory (ROM) containing test routines which is shared among the two CPU cores. ROM 30 contains test programs and test vectors for testing the CPU cores 14, 16. ROM 30 transmits these test vectors over busses 20, 22 to CPU cores 14, 16. These test vectors can appear as instructions which are executed on the CPU cores. Additionally, ROM 30 may contain compare routines to compare a data operand written to cache 12 by CPU cores 14, 16. When the data operand does not match the expected value stored in ROM 30, an error is detected and the CPU core that wrote the data operand is marked as defective.

Since ROM 30 is shared among the two CPU cores, the cost for including ROM 30 on the DP die is shared among the two CPU cores. ROM 30 is a much higher density array structure than cache 12 so that the additional die area for ROM 30 is minimal. ROM 30 may also include test sequencing logic to initiate and control the test routines which can operate at the full clock rate of the CPU cores. Thus the testing of the CPU cores is accelerated compared to an external tester supplying test vectors over bonding pads 18. This reduces test cost.

ROM 30 may also contain test routines and vectors for testing cache memory 12. Test patterns such as checkerboard, walking ones and zeros can easily be generated by a simple test routine.

Alternate Embodiments

Several other embodiments are contemplated by the inventor. For example the shared cache memory may be either a primary, level-one cache, or a second-level or even third-level cache shared among the two processors. This shared cache may include a variety of other structures such as a bus-interface unit (BIU), snoop and invalidation logic, translation logic or arrays, and instruction or branch buffering or prediction logic along with an instruction prefetcher. A floating point unit (FPU) may also be located within the cache portion of the die, allowing a single FPU to be shared among the two CPU cores.

The CPU core itself typically is a general-purpose processor core which can execute general-purpose instructions from an instruction set such as a RISC or a CISC instruction set. A great variety of programs may be executed by the CPU core. The CPU core is preferably a pipelined processor core including one or more execution pipelines. An execution pipeline may contain an instruction fetcher, decoder, an address generate unit and operand fetcher, an operation unit such as an arithmetic-logic-unit (ALU) and possibly a branch unit. For superscalar CPU cores, each execution pipeline may contain a subset of these units; for example a branch pipeline contains the branch unit while a load/store pipeline contains the address generate unit and operand fetcher.

Rather than write operands to the shared cache, the CPU cores can be tested by a scan chain. The CPU core is tested with stimuli from the ROM for a period of time, then the CPU core's clock is stopped and data in the scan chain is shifted out of the CPU core and checked for errors. The scan chain can include registers and nodes deep within the CPU core's pipeline.

The invention may be extended to three or more CPU cores sharing one or more cache memories. Other redundant units may be included, such as redundant MPEG encoders. For superscalar CPU cores, when the pipelines are symmetrical it is possible to disable one or more of the pipelines and operate the CPU core as a uniscalar CPU rather than a superscalar CPU.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A method of manufacturing microprocessors comprising:

fabricating on a wafer a plurality of dual-processor die, each dual-processor die having a first CPU core, a second CPU core, a shared memory, and a plurality of bonding pads;

(a) making temporary electrical contact with the plurality of bonding pads on a first die (b)

(b) determining whether the shared memory contains a defect be applying a first set of stimuli to the plurality of bonding pads on the first die;

(c) upon a determination that the shared memory contains a defect, marking the first die as defective;

(d) determining whether the first CPU core contains a defect by applying a second set of stimuli to the plurality of bonding pads on the first die;

(e) determining whether the second CPU core contains a defect by applying a third set of stimuli to the plurality of bonding pads on the first die;

(f) upon determinations that the first CPU core contains a defect and that the second CPU core contains a defect, marking the first die as defective;

(g) upon determinations that the shared memory does not contain a defect and that the first CPU core does not contain a defect, marking the first die with a first functional marking;

(h) upon determinations that the shared memory does not contain a defect and that the second CPU core does not contain a defect, marking the first die with a second functional marking; and removing the temporary electrical contact with the first die and successively repeating steps (a) through (h) for each of the other dual-processor die.

2. The method of claim 1 further comprising the step of:

sawing the wafer into individual die;

separating die marked as defective from die indicated to be functional; and packaging die indicated to be functional as single-microprocessor chips by disabling either the first CPU core or the second CPU core, wherein die are packaged as single-microprocessor chips when either one or both of the CPU cores are functional and the shared memory is functional.

3. The method of claim 2 further comprising the steps of:

packaging the first die as a dual-processor chip when the shared memory and both the first CPU core and the second CPU core do not contain defects;

packaging the first die as a uni-processor chip when the shared memory does not contain a defect and either the first CPU core or the second CPU core but not both contain no defects, whereby both dual-processor chips and uni-processor chips are made from the wafer.

4. The method of claim 3 further comprising the step of disabling the second CPU core by bonding an option bonding pad to activate a means for disabling the second CPU core.

5. The method of claim 3 further comprising the step of disabling the second CPU core by powering-down the second CPU core.

6. The method of claim 3 wherein the steps of (d) determining whether the first CPU core contains a defect by applying a second set of stimuli to the plurality of bonding pads on the first die;

(e) determining whether the second CPU core contains a defect by applying a third set of stimuli to the plurality of bonding pads on the first die;

each comprise applying a set of CPU-test stimuli to the plurality of bonding pads, wherein the set of CPU-test stimuli is substantially the same stimuli for both the first CPU core and the second CPU core.

7. An apparatus for manufacturing a microprocessor comprising;

a first processor core on a microprocessor die for executing general-purpose programs comprising instructions from an instruction set;

a second processor core on the microprocessor die for executing general-purpose programs comprising instructions from the instruction set, the second processor core substantially identical in function and capability to the first processor core;

a shared memory on the microprocessor dies coupled to the first processor core and coupled to the second processor core, for supplying instructions, to the first processor core and for supplying instructions to the second processor core;

bonding pads on the microprocessor die for connecting the shared memory to external devices, the first processor core and the second processor core accessing external devices through the shared memory and the bonding pads; and a marking on the microprocessor die for indicating the level of functionality of the first processor core, the second processor core and the shared memory;

wherein the marking is selected from the group consisting of a first defect marking indicating that the shared memory contains a defect, a second defect marking indicating that the first processor core contains a defect and that the second processor core contains a defect, a first functional marking indicating that the shared memory does not contain a defect and that the first processor core does not contain a defect, and a second functional marking indicating that the shared memory does not contain a defect and that the second processor core does not contain a defect, whereby the first processor core and the second processor core are each for executing the general-purpose programs by receiving instructions from the shared memory.

8. The microprocessor die of claim 7 wherein the first processor core occupies a first portion of the microprocessor die while the second core occupies a second portion of the microprocessor die and the shared memory occupies a third portion of the microprocessor die, the first portion and second portion being substantially equivalent in die area but the die area for first portion being less than the die area for the third portion occupied by the shared memory, whereby the shared memory occupies a larger area of the microprocessor die than does the first processor core or the second processor core.

9. The microprocessor die of claim 8 wherein the first processor core contains a defect rendering the first processor core defective and non-functional, the shared memory and the second processor core being functional.

10. The microprocessor die of claim 9 contained within a package having electrical leads connecting the bonding pads to pins for connecting to external devices, the electrical leads disabling the first processor core having the defect but enabling the second processor core and the shared memory.

11. The microprocessor die of claim 9 wherein the shared memory comprises:

an array of rows of memory cells for storing instructions;

a defective row within the array of rows, the defective row not able to store instructions;

a redundant row of memory cells for storing instructions instead of the defective row, whereby the shared memory is defect-tolerant, allowing the defective row to be replaced by the redundant row of memory cells.

12. The microprocessor die of claim 8 further comprising:

a read-only memory, coupled to the first processor core and coupled to the second processor core, for supplying test stimuli to the first processor core and to the second processor core to determine if the first processor core or if the second processor core contains a defect rendering the first processor core or the second processor core non-functional.

13. The microprocessor die of claim 12 wherein the test stimuli comprise test instructions for execution on the first processor core and on the second processor core.

* * * * *

UNITED STATES PATENT AND TRADEMARK OFFICE
CERTIFICATE OF CORRECTION

PATENT NO.   : 5,828,578

DATED        : October 27, 1998

INVENTOR     : James S. Blomgren

It is certified that error appears in the above-identified patent and that said Letters Patent is hereby corrected as shown below:

Column 12, line 44, replace "die (b)" with --die;--.

Column 12, line 46, replace "be" with --by--.

Column 13, line 45 replace "comprising;" with --comprising:--.

Column 13, line 54 replace "dies" with --die,--.

Column 13, line 57 replace "instructions," with --instructions--.

Column 14, line 3 replace "core" with --core,--.

Signed and Sealed this

Second Day of February, 1999

Attest:

*Attesting Officer*

*Acting Commissioner of Patents and Trademarks*